(12) United States Patent
Brown et al.

(10) Patent No.: US 6,171,918 B1
(45) Date of Patent: Jan. 9, 2001

(54) DEPLETED POLY MOSFET STRUCTURE AND METHOD

(75) Inventors: Jeffrey S. Brown, Middlesex; Robert J. Gauthier, Hinesburg; Edward J. Nowak; Minh H. Tong, both of Essex Junction; Steven H. Voldman, South Burlington, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/102,413

(22) Filed: Jun. 22, 1998

(51) Int. Cl.[7] ............... H01L 21/8238; H01L 21/336
(52) U.S. Cl. ................ 438/305; 438/231; 438/232; 438/307
(58) Field of Search .................. 438/231, 232, 438/307, 305; 257/400

(56) References Cited

U.S. PATENT DOCUMENTS

| | | | |
|---|---|---|---|
| 4,183,040 | 1/1980 | Rideout | 357/41 |
| 4,784,965 | 11/1988 | Woo et al. | 437/30 |
| 4,843,023 | * 6/1989 | Chiu et al. | 437/34 |
| 4,951,100 | * 8/1990 | Parrillo | 357/233 |
| 5,015,595 | * 5/1991 | Wollesen | 437/31 |
| 5,108,940 | 4/1992 | Williams | 437/44 |
| 5,212,542 | 5/1993 | Okumura | 257/369 |
| 5,252,848 | 10/1993 | Adler et al. | 257/328 |
| 5,275,961 | 1/1994 | Smayling et al. | 437/41 |
| 5,401,994 | 3/1995 | Adan | 257/335 |
| 5,480,830 | 1/1996 | Liao et al. | 437/58 |
| 5,648,668 | 7/1997 | Kasai | 257/280 |
| 5,856,226 | * 1/1999 | Wu | 438/291 |

\* cited by examiner

Primary Examiner—John F. Niebling
Assistant Examiner—Alexander G. Ghyka
(74) Attorney, Agent, or Firm—McGinn & Gibb, PLLC; Eugene I. Shkurko, Esq.

(57) ABSTRACT

A method for doping a poly depleted semiconductor transistor, the semiconductor transistor including a gate region, a source region adjacent the gate region and a drain region adjacent the gate region and opposite the source region, the method comprising steps of exposing the gate region to a first ion implantation and shielding the gate region from a second ion implantation step.

14 Claims, 5 Drawing Sheets

DEPLETED POLY MOSFET STRUCTURE AND METHOD

BACKGROUND OF THE INVENTION

1. Field of the Invention

The present invention generally relates to processes for fabricating metal oxide semiconductor field effect transistor (MOSFET) structures and more particularly to MOSFET structures which include lightly doped polysilicon gates, operating at high operating voltages, and MOSFET structures which include more heavily doped polysilicon gate structures which operate at low operating voltages.

2. Description of the Related Art

As the gate oxide thickness decreases in today's advanced complementary metal oxide semiconductor (CMOS) technologies, the maximum voltage (Vmax) allowed across the gate oxide also decreases. The decrease in Vmax makes interfacing with previous technologies which have higher supply voltages more difficult.

A conventional solution to interface previous technologies which have higher supply voltages involves using circuit techniques to step down the voltage which is seen across the oxide or creating a dual oxide process which supports a higher Vmax. Using circuit techniques to step down the voltage increases circuit complexity and decreases overall chip speed. Using a dual oxide process increases the processing cost and complexity.

Conventional methods form CMOS devices on a single wafer. Each of the CMOS devices includes a polysilicon gate and a thin gate oxide between the polysilicon gate and the substrate. Ions are implanted to dope the polysilicon gate and the adjacent source and drain structures.

Conventionally, selected polysilicon gates are protected with a sacrificial layer and the remaining polysilicon gates are subjected to a first ion implantation of the extension or lightly doped drain, such that only the polysilicon gates which are exposed receive the lightly doped drain implant.

Conventional processes then dope other polysilicon gates using the source-drain implant. In such a second ion implantation step, selected polysilicon gates are protected with another sacrificial layer and the exposed polysilicon gates are subject to the second ion implantation. This repetitive masking-implantation process produces some polysilicon gates with lighter doping and other polysilicon gates with heavier doping. The blocking of the second ion implantation produces lightly doped gates in the blocked devices, which are sometimes referred to as poly depleted gates. The lightly doped or undoped polysilicon gates accommodate higher voltages due to the added poly depletion which occurs.

While such conventional methods simultaneously produce CMOS chips which can handle high voltages and CMOS chips which can handle low voltages, the conventional methods require additional processing steps to deposit and remove additional sacrificial layers and require additional implantation steps.

SUMMARY OF THE INVENTION

It is, therefore, an object of the present invention to provide a structure and method for simultaneously manufacturing CMOS chips which include heavily doped and lightly doped polysilicon gates (which can accommodate high and low voltages) without requiring additional processing steps for the lightly doped gates. More specifically, with the invention the polysilicon gate is doped at the same time when the extension and source/drain are implanted, to eliminate the need for additional masking and ion implantation steps.

The invention includes a method for doping a semiconductor transistor, the semiconductor transistor including a gate region, a source region adjacent the gate region and a drain region adjacent the gate region and opposite the source region, the method comprising exposing the gate region to a first ion implantation and shielding the gate region from a second ion implantation step.

One of the first ion implantation and the second ion implantation comprises a lower dose implant than the other. The shielding step comprises a step of forming a protective sacrificial layer over the gate region. The first ion implantation and the second ion implantation comprise steps of doping the gate region, the source region and the drain region with an impurity. The impurity comprises arsenic.

The invention also includes a method of simultaneously forming high voltage transistors and low voltage transistors on a semiconductor wafer comprising steps of forming an oxide layer on a substrate of the wafer, forming a polysilicon layer on the oxide layer, selectively removing the polysilicon layer and the oxide layer from the substrate to form gate regions comprising the polysilicon layer and the oxide layer, source regions adjacent the gate regions, and drain regions adjacent the gate regions and opposite the source regions, implanting a first concentration of ions to the gate regions, the source regions, and the drain regions, shielding a first group of the gate regions and leaving a second group of the gate regions exposed and implanting a second concentration of ions to the second group of the gate regions, the source regions and the drain regions.

The first concentration is lower than the second concentration. The first group of gates comprise gates of the high voltage transistors and the second group of gates comprise gates of the low voltage transistors. The high voltage transistors and the low voltage transistors comprise field effect transistors. The shielding step comprises a step of forming a protective sacrificial layer over the first group of the gate regions. The step of implanting a first concentration and the step of implanting a second concentration comprise steps of doping the gate regions, the source regions and the drain regions with an impurity.

The invention also includes a method for preventing silicide spiking in semiconductor transistors, the semiconductor transistors having gate regions, source region adjacent the gate regions and drain region adjacent the gate regions and opposite the source regions, the method comprising a step of forming a silicide block adjacent the gate regions. The step of forming a silicide block comprises a step of depositing a nitride layer adjacent the gate regions.

Thus, by using only the extension or lightly doped drain implant to lightly dope the poly gate in the depleted devices, the invention does not require the additional masks required in the conventional processes.

The lighter doped gate causes poly depletion to occur, which increases the maximum voltage (Vmax) which the oxide can accommodate before suffering damage. Therefore, with the invention, high voltage and low voltage MOS devices can be simultaneously manufactured in a process which does not require the additional mask deposition and removal steps required with other depleted polysilicon device processes.

BRIEF DESCRIPTION OF THE DRAWINGS

The foregoing and other objects, aspects and advantages will be better understood from the following detailed description of preferred embodiments of the invention with reference to the drawings, in which:

FIG. 1(*b*) is a schematic diagram of a p-type semiconductor transistor according to the invention;

FIG. 1(*c*) is a flow diagram illustrating the process of the invention;

DETAILED DESCRIPTION OF PREFERRED EMBODIMENTS OF THE INVENTION

Figure 1A:
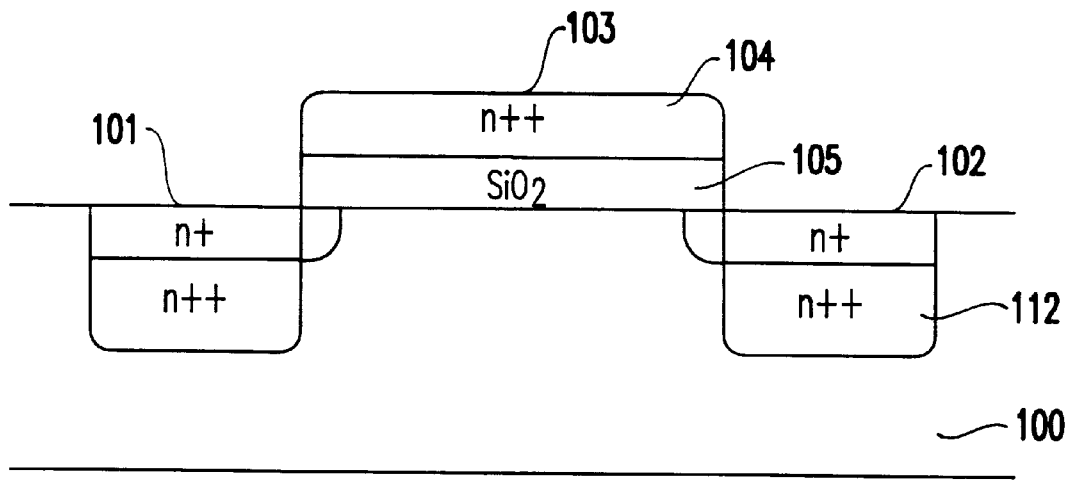
FIG. 1(*a*) is a schematic diagram of an n-type semiconductor transistor according to the invention.
Figure 1B:
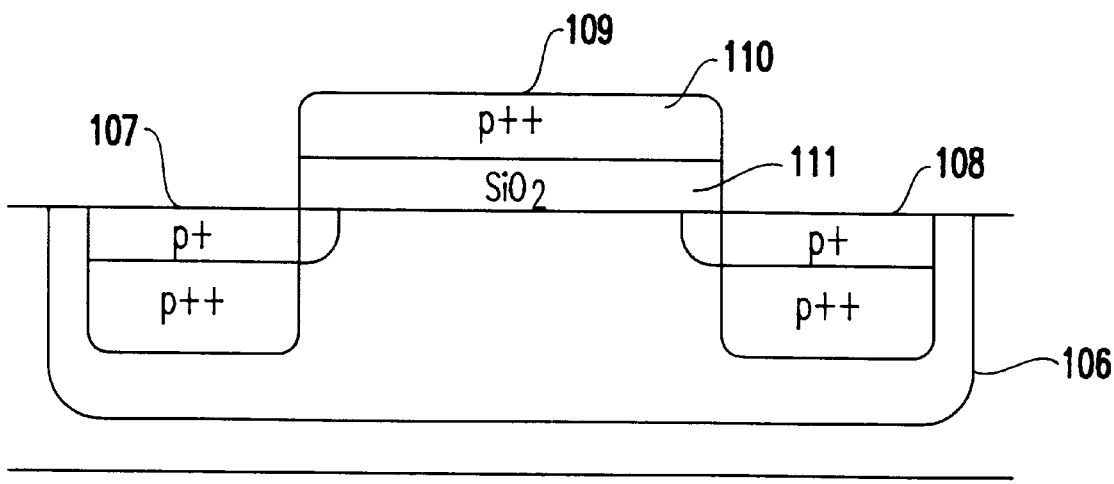
Figure 1C:
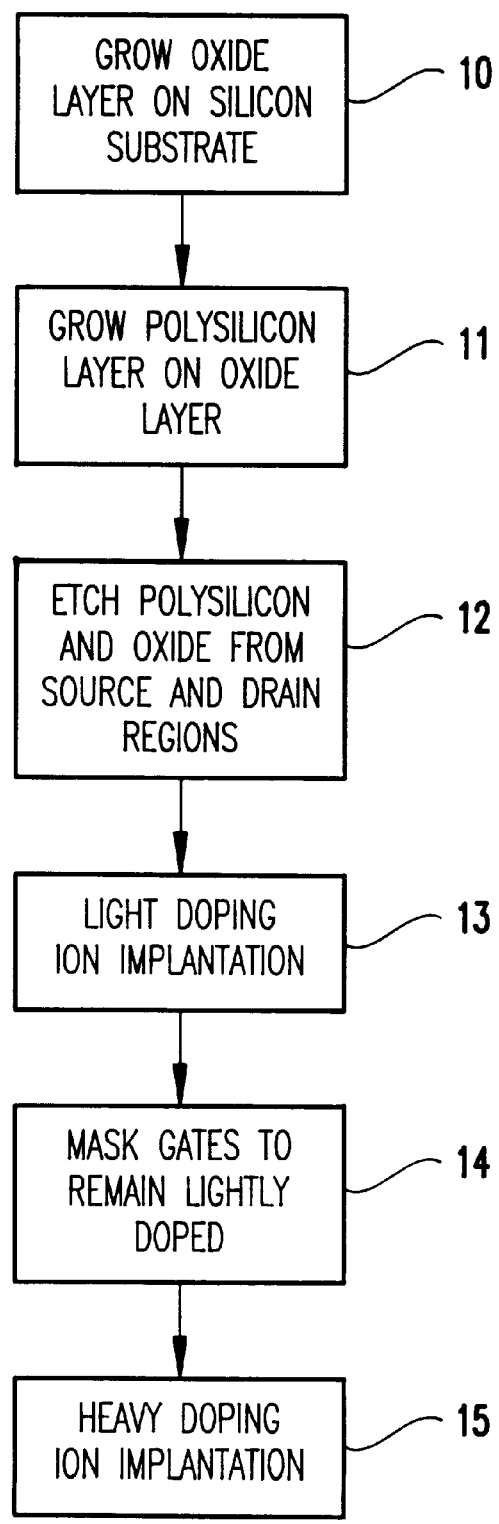

Referring now to the drawings, and more particularly to FIGS. 1(*a*) and 1(*b*), N-type field effect transistors (NFET) and P-type field effect transistors (PFET) in advanced complementary metal-oxide semiconductor (CMOS) technologies are illustrated.

More specifically, FIG. 1(*a*) illustrates a substrate 100, a drain 101, a source 102 and a gate 103. The source 102 includes a heavily doped region 112. The gate 103 includes a doped polysilicon layer 104 which is doped during the source 102, drain 101, and heavily doped region 112 implants. The doped polysilicon layer 104 is separated from the substrate 100 by an insulating silicon dioxide layer 105.

Similarly, FIG. 1(*b*) illustrates a drain 107, source 108 and a gate 109 having a polysilicon gate layer 110 insulated from an N-well 106 by a silicon dioxide insulating layer 111. The structure illustrated in FIG. 1(*a*) is an N-type CMOS structure while the structure illustrated in FIG. 1(*b*) is a P-type CMOS structure.

The above structures include lightly doped regions $n^+$, $p^+$ and heavily doped regions $n^{++}$, $p^{++}$ which are implanted into, for example, the polysilicon gates.

While conventional methods can be utilized to form a poly-depleted metal oxide semiconductor field effect transistor (MOSFET), the inventive method, described below, is superior to conventional methods and structures in that the MOSFET device is created without requiring any additional masks (such as the second sacrificial layer discussed in the Background section, above) and the inventive method allows light doping in the poly gate to occur.

Referring now to FIGS. 1(*a*)–5, a preferred method of the invention is the illustrated. More specifically, in Block 10 an oxide layer 25, 45, such as silicon dioxide, is grown on the substrate 20, 40 (e.g., see FIGS. 1(*c*), 2 and 4). Next, as shown in Block 11, a polysilicon on layer 24, 44 is grown on the oxide layer 25, 45. As would be known by one ordinarily skilled in the art in light of this disclosure, the polysilicon layer and oxide layer could be formed by a number of common techniques, such as liquid phase chemical vapor deposition (LPCVD). The polysilicon and oxide layers are etched, using common etching techniques such as reactive ion etching (RIE), to form source and drain regions 21, 22 and 41, 42, as shown in Block 12.

Without any additional sacrificial layers, the entire structure is subjected to a light doping implantation, as illustrated in Block 13. As illustrated in Block 14, a mask 30, 50, is selectively deposited (using conventional photolithographic and etching techniques) to cover selected ones 23, 43 of the polysilicon gates which are to remain only lightly doped (e.g., see FIGS. 1(*c*), 2–5). The polysilicon gates 103, 109 which are to be heavily doped do not receive the protective mask (e.g., the photolithographic and etching techniques remove the mask from the polysilicon gates 103, 109 which are to be heavily doped).

A second ion implantation for heavier doping is then applied to the exposed (e.g., unmasked) polysilicon gates 103, 109, as well as the source and drain regions 21, 22; 41, 42; 102, 108 and 101, 107, as illustrated in Block 15.

As would be known by one ordinarily skilled and the art, the first lighter ion implantation could use an appropriate dopant, such as arsenic, provided at a dose of approximately $1 \times 10^{13}$–$5 \times 10^{13}$ atoms/cm$^2$, while the second heavier ion implantation step comprises a dose of approximately $2 \times 10^{15}$–$6 \times 10^{15}$ atoms/cm$^2$. After implantation, an activation process such as rapid thermal annealing is performed to activate the arsenic which was implanted.

Figure 2:
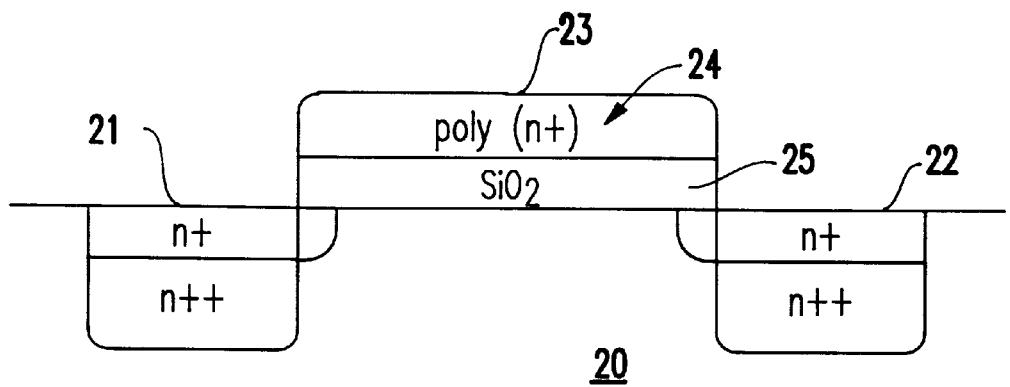
FIG. 2 is a schematic diagram of an n-type semiconductor transistor according to the invention.
Figure 4:
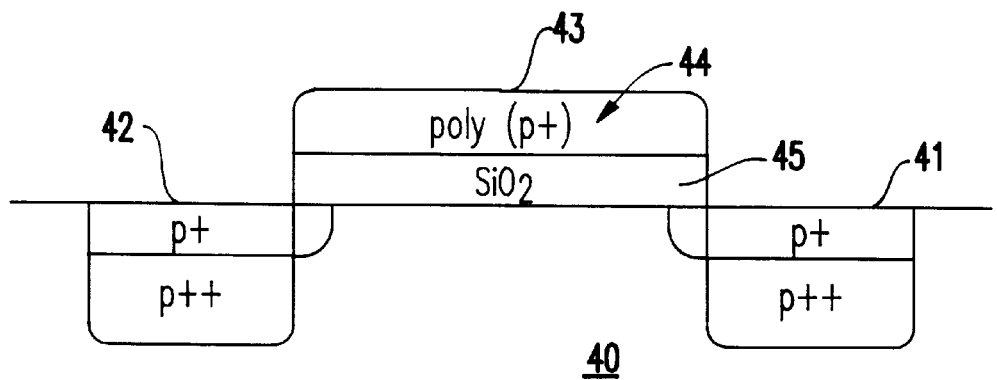
FIG. 4 is a schematic diagram of a p-type semiconductor transistor according to the invention.

The above-mentioned method simultaneously produces, on the same wafer, the structures illustrated in FIGS. 1(*a*)–(*b*) which include heavily doped gates 103 $n^{++}$, 109 $p^{++}$ and the structures illustrated and FIGS. 2 and 4 which include lightly doped gates 23 $n^+$, 43 $p^+$, for given N and P type transistors through the use of the masks 30, 50.

More specifically, FIG. 2 illustrates a poly depleted NFET which is highly useful for higher voltage input/output interface applications. FIG. 2 includes a substrate 20, a drain 21, a source 22 and a gate 23. As before, the gate includes a polysilicon layer 24 and an insulating silicon dioxide layer 25. Further, the polysilicon layer 24 comprises only an extension lightly doped drain (Ldd) implant which makes it lightly doped (e.g., $n^+$).

Figure 3:
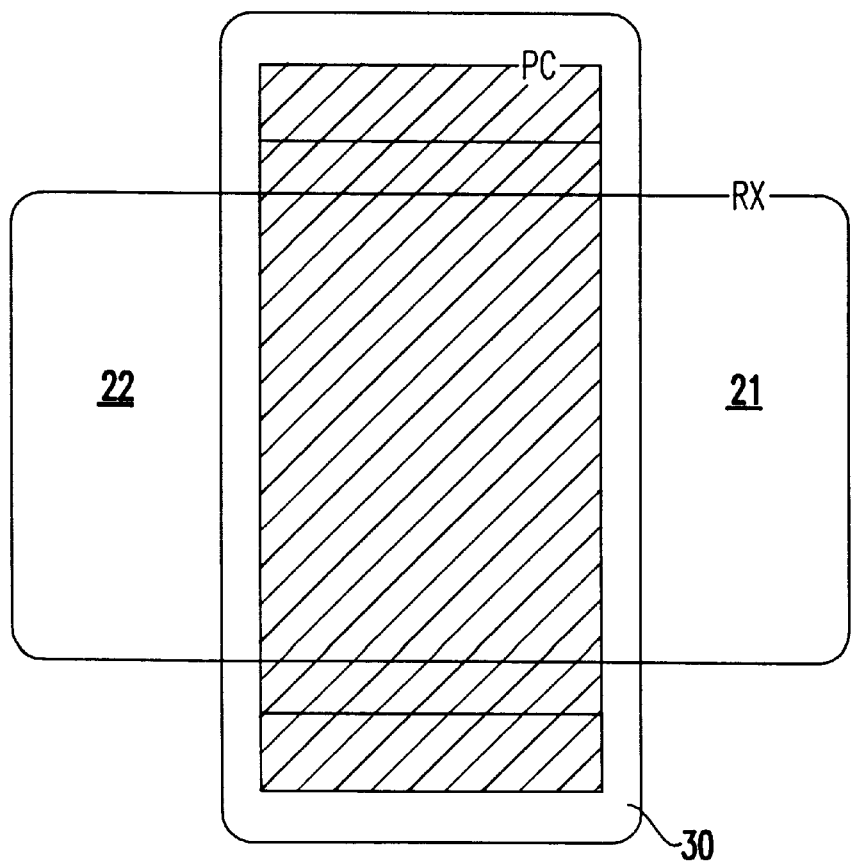
FIG. 3 is a schematic diagram illustrating a sacrificial mask used in the invention.

FIG. 3 is a top view of the inventive transistor structure and includes a mask 30, which is used during the ion implantation stage to protect the gate structure from becoming heavily doped, as is discussed above.

Figure 5:
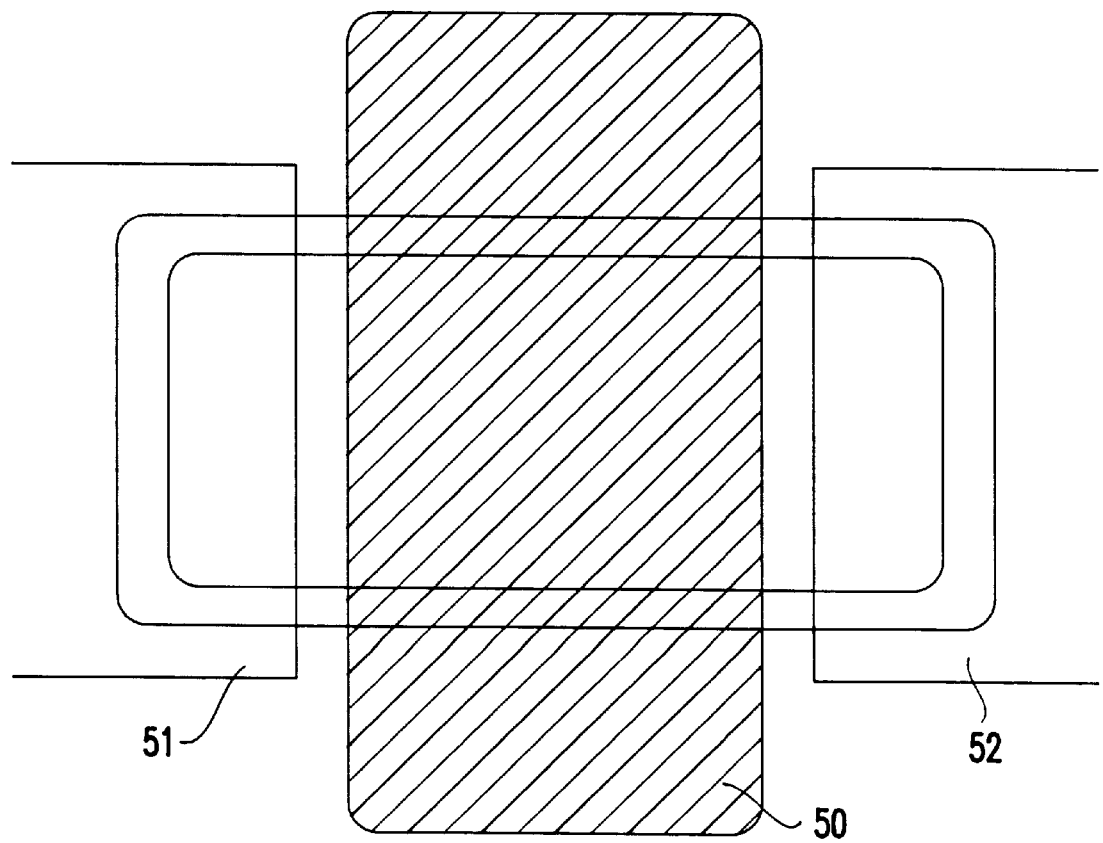
FIG. 5 is a schematic diagram illustrating a sacrificial mask used in the invention.

FIGS. 4 and 5 are similar to FIGS. 2 and 3. However, while FIGS. 2 and 3 illustrate an NFET, FIGS. 4 and 5 illustrate a PFET. More specifically, FIG. 4 shows a cross-sectional view of a poly depleted PFET. FIG. 4 includes a substrate 40, source 41, drain 42 and gate 43. The gate 43 includes a lightly doped polysilicon layer 44 which is separated from the substrate 40 by an oxide layer 45.

FIG. 5 illustrates a top view of the PFET transistor structure which include a mask 50 for protecting the polysilicon gates from heavy ion implantation. Masks 51 and 52 allow the source and drain doping to only be implanted in source drain regions and not into the poly gate. The extension/Ldd implant is not blocked and the gate receives this implant.

A key feature of the invention is that the polysilicon gate is lightly doped at the same time when the extension/Ldd are lightly doped. Therefore, with the invention, no additional mask deposition or removal steps are required, as they are with the conventional methods/structures.

The lightly doped gate causes poly depletion to occur, which increases the maximum voltage (Vmax) which the oxide can accommodate before suffering damage. Therefore, with the invention, high voltage and low voltage chips can be simultaneously manufactured in a process which does not require the additional mask deposition and removal steps required with the conventional processes.

Figure 6:
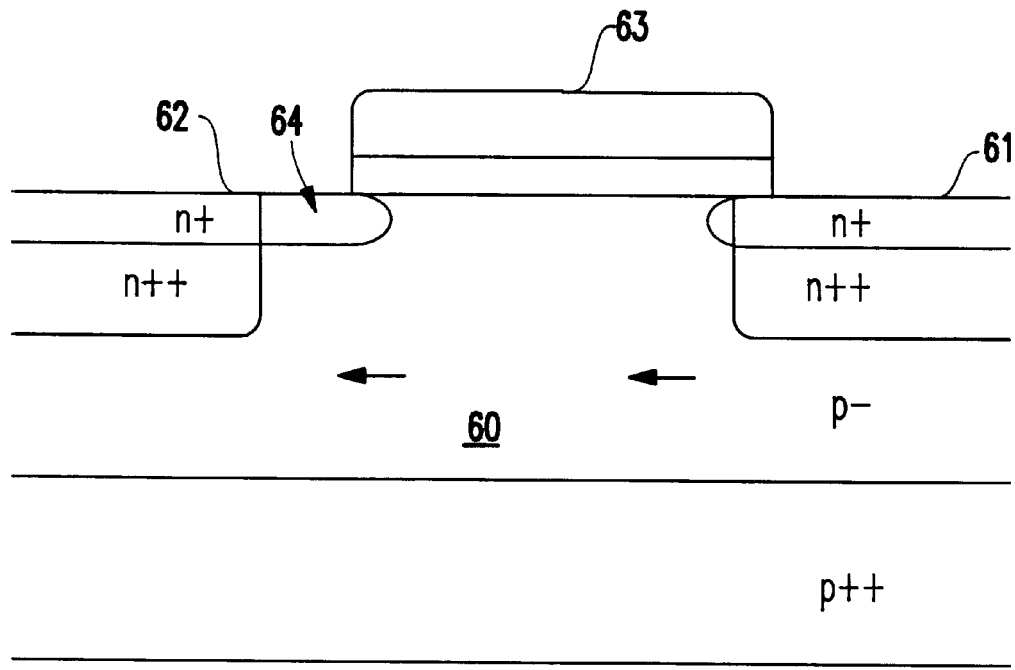
FIG. 6 is a schematic diagram of a semiconductor transistor according to the invention.

A second embodiment of the invention reduces or eliminates undesirable junction spiking which could occur when a portion of the extension region is exposed. More specifically, the structure in FIG. 6 includes a substrate 60, a source region 61, a drain region 62 and a gate region 63. FIG. 6 also illustrates how insufficient overlay tolerances could leave part of the extension region exposed 64, when, for example, the source and drain are no longer self-aligned.

A problem occurs in that silicide may cover the exposed region 64, below which is no source/drain implant, but only the extension/Ldd layer. Subsequent processing would place silicide over the exposed area which could cause a spike to travel down through the extension region, thus causing leakage. This situation is referred to as "silicide spiking".

Figure 7:
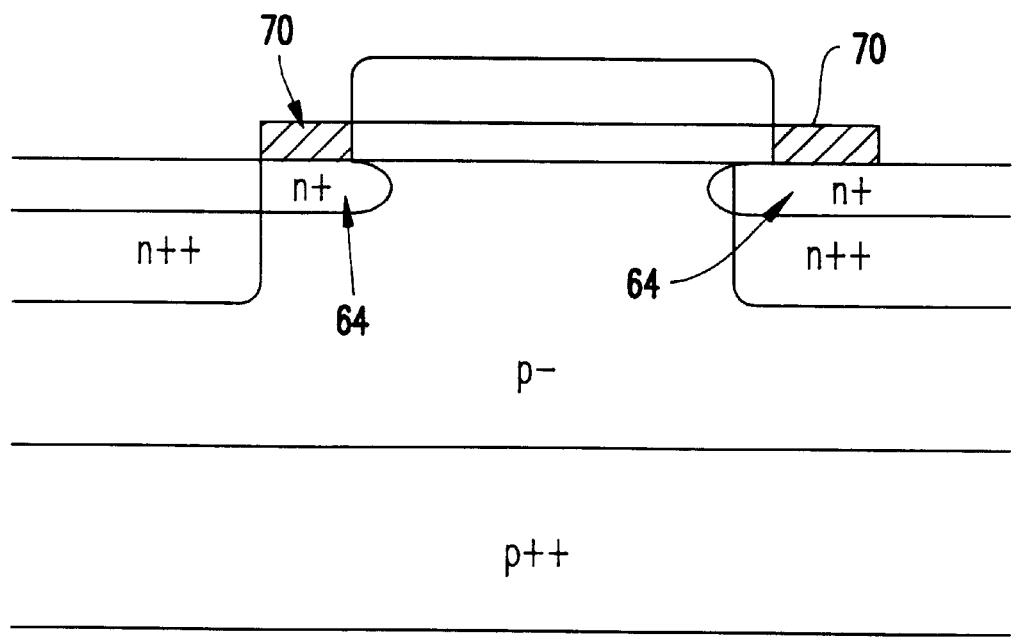
FIG. 7 is a schematic diagram of a semiconductor transistor according to the invention.

To overcome this problem, a silicide blocking process is used to block silicide in areas next to the poly sidewall to account for overlay tolerances. For example, one silicide blocking process involves depositing a nitride blocking layer in areas where no silicide is to be found. More specifically, as shown in FIG. 7, a block 70 could be formed over the exposed region 64.

The benefits of this structure and method allow the formation of poly depleted devices (higher Vmax) and high performance (non-depleted poly) devices on the same chip. The higher allowed Vmax allows the inventive device to be used in additional applications.

While the invention has been described in terms of preferred embodiments, those skilled in the art will recognize that the invention can be practiced with modification within the spirit and scope of the appended claims.

What is claimed is:

1. A method for doping a semiconductor transistor, said semiconductor transistor including a gate region, a source region adjacent said gate region and a drain region adjacent said gate region and opposite said source region, said method comprising:
   simultaneously doping said gate region, said source region and said drain region with a first ion implantation; and
   shielding said gate region and simultaneously doping said source region and said drain region with a second ion implantation,
   wherein said first ion implantation comprises a lower dose than said second ion implantation.

2. The method as in claim 1, wherein said shielding comprises forming a protective sacrificial layer over said gate region.

3. The method as in claim 1, wherein said impurity comprises arsenic.

4. A method of simultaneously forming high voltage transistors and low voltage transistors on a semiconductor wafer comprising:
   forming an oxide layer on a substrate of said wafer;
   forming a polysilicon layer on said oxide layer;
   selectively removing said polysilicon layer and said oxide layer from said substrate to form gate regions comprising said polysilicon layer and said oxide layer, source regions adjacent said gate regions, and drain regions adjacent said gate regions and opposite said source regions;
   implanting a first concentration of ions to said gate regions, said source regions, and said drain regions;
   shielding a first group of said gate regions and leaving a second group of said gate regions exposed; and
   implanting a second concentration of ions to said second group of said gate regions, said source regions and said drain regions,
   wherein said first concentration is lower than said second concentration.

5. The method as in claim 4, wherein said first group of gates comprise gates of said high voltage transistors and said second group of gates comprise gates of said low voltage transistors.

6. The method as in claim 4, wherein said high voltage transistors and said low voltage transistors comprise field effect transistors.

7. The method as in claim 4, wherein said shielding comprises forming a protective sacrificial layer over said first group of said gate regions.

8. The method as in claim 4, wherein said implanting a first concentration and said implanting a second concentration comprise steps of implanting an impurity.

9. A method of simultaneously forming high voltage transistors and low voltage transistors on a semiconductor wafer comprising:
   forming an oxide layer on a substrate of said wafer;
   forming a polysilicon layer on said oxide layer;
   selectively removing said polysilicon layer and said oxide layer from said substrate to form gate regions comprising said polysilicon layer and said oxide layer, source regions adjacent said gate regions, and drain regions adjacent said gate regions and opposite said source regions;
   implanting a first concentration of ions to said gate regions, said source regions, and said drain regions;
   shielding a first group of said gate regions and leaving a second group of said gate regions exposed;
   implanting a second concentration of ions to said second group of said gate regions, said source regions and said drain regions; and
   forming a silicide block adjacent said gate regions.

10. The method as in claim 9, wherein said forming a silicide block comprises depositing a nitride layer adjacent said gate regions.

11. A method for preventing silicide spiking in semiconductor transistors, said semiconductor transistors comprising gate regions, source region adjacent said gate regions and drain region adjacent said gate regions and opposite said source regions, said method comprising:
   simultaneously doping said gate region, said source region and said drain region with a first ion implantation;
   shielding said gate region and simultaneously doping said source region and said drain region with a second ion implantation; and
   forming a silicide block adjacent said gate regions,
   wherein said first ion implantation comprises a lower dose than said second ion implantation.

12. The method as in claim 11, wherein said forming a silicide block comprises a step of depositing a nitride layer adjacent said gate regions.

13. The method as in claim 11, wherein said shielding comprises forming a protective sacrificial layer over said gate region.

14. The method as in claim 11, wherein said impurity comprises arsenic.

* * * * *